(12) United States Patent
Hassard et al.

(10) Patent No.: US 6,236,097 B1
(45) Date of Patent: May 22, 2001

(54) ELECTRONICALLY GATED MICROSTRUCTURE

(75) Inventors: John Francis Hassard; Roland Smith, both of London (GB)

(73) Assignee: Imperial College of Science, Technology & Medicine, London (GB)

( * ) Notice: Subject to any disclaimer, the term of this patent is extended or adjusted under 35 U.S.C. 154(b) by 0 days.

(21) Appl. No.: 09/029,533

(22) PCT Filed: Aug. 30, 1996

(86) PCT No.: PCT/GN96/02101

§ 371 Date: Feb. 27, 1998

§ 102(e) Date: Feb. 27, 1998

(87) PCT Pub. No.: WO97/09745

PCT Pub. Date: Mar. 13, 1997

(30) Foreign Application Priority Data

Sep. 1, 1995 (GB) .................................................. 9517930

(51) Int. Cl.[7] ........................ H01L 31/00; H01L 31/0312
(52) U.S. Cl. ........................ 257/459; 257/431; 257/466; 257/77; 438/98
(58) Field of Search ........................ 257/77, 431, 448, 257/459, 466; 438/98

(56) References Cited

U.S. PATENT DOCUMENTS

| | | | |
|---|---|---|---|
| 4,301,591 | * 11/1981 | Withers | 29/572 |
| 4,360,246 | 11/1982 | Figueroa et al. | . |
| 4,764,679 | * 8/1988 | McDaniel et al. | 250/374 |
| 4,873,696 | * 10/1989 | Coldren et al. | 372/96 |
| 4,899,200 | 2/1990 | Shur et al. | . |
| 5,107,315 | 4/1992 | Kumagai et al. | . |
| 5,212,395 | * 5/1993 | Berger et al. | 257/185 |
| 5,233,556 | 8/1993 | Matsuda et al. | . |
| 5,506,422 | 4/1996 | Dreifus et al. | . |
| 5,521,386 | * 5/1996 | Taboada | 250/363.02 |
| 5,663,576 | * 9/1997 | Shimizu | 257/59 |
| 5,905,264 | * 5/1999 | Shahar et al. | 250/370.01 |

FOREIGN PATENT DOCUMENTS

WO 92/20105 11/1992 (WO) .
WO 95/12134 5/1995 (WO) .

OTHER PUBLICATIONS

International Search Report mailed Jan. 14, 1997 for PCT/GB96/02100.
International Search Report mailed Dec. 20, 1996 for PCT/GB96/02101.
Applied Physics Letters, vol. 41, No. 7, Oct. 1982, pp. 599–601, Auston D.H. and Smith P.R. entitled "Picosecond Optical Electronic Sampling: Characterization of High–Speed Photodectors".
Applied Physics Letters, vol. 54, No. 6, Feb. 6, 1989, pp. 543–545, Taylor G.W. et al. entitled "Optoelectronic Dynamic Random Access Memory Cell Utilizing a Three–Terminal N–Channel Self–Aligned Double–Heterostructure Optoelectronic Switch".

* cited by examiner

Primary Examiner—Eddie C. Lee
Assistant Examiner—Allan R. Wilson
(74) Attorney, Agent, or Firm—Wallenstein & Wagner, LTD

(57) ABSTRACT

A solid state microstructure comprises a substrate, a detector element extending outwardly from a surface of the substrate and having first and second electrodes on opposing sides thereof, the detector element incorporating an onboard electronically-triggered gating structure. The gating structure may for example be a third electrode.

19 Claims, 2 Drawing Sheets

ELECTRONICALLY GATED MICROSTRUCTURE

DESCRIPTION

1. Technical Field

The present invention relates to a solid state microstructure, and particularly to a microstructure having an electronically triggered onboard gating arrangement.

2. Background of the Invention

Many imaging and probing applications in the infra-red visible light regions (lidar, mammography), in the UV and x-ray regions (medical imaging), and applications using ionising particles, suffer from scattering problem. Typically, scattered photons or particles which do not pass directly from the source to the object and to the detection system result in noise. This noise may greatly degrade the desired signal or image, particularly in the case of soft tissue probing by use of visible or infra-red laser light. In many applications, the image can greatly be improved by the use of a time-resolved or a time-gated detection system.

Such systems are currently complex and expensive, and currently are conceived as separate add-on units which are normally used in conjunction with conventional detectors.

Similar problems apply to particle detection techniques such as slow neutron imaging. Time gating in the subnanosecond range, particularly with silicon detectors, can be difficult. In the x-ray range the time gate of, of example, microchannel plate devices can approach the 100 ps range, and the best spatial resolution which can be obtained in the dimension along the line of the light without some sophisticated deconvolution technique, for example, is thus of order a few cm. This is inadequate for most useful medical imaging techniques. The time resolution of these gated structures is accordingly not entirely satisfactory, and generally depends upon a combination of the rise time of the gating pulse, and the response of the detector.

SUMMARY OF THE INVENTION

It is an object of the present invention at least to alleviate the problems of the prior art.

It is a further object to provide a solid state microstructure detector which can be gated very rapidly and which does not require a separate gating element.

According to the present invention there is provided a solid state (switch) microstructure comprising a substrate, a detector element extending outwardly from a surface of the substrate and having first and second electrodes on opposing sides thereof, the detector element incorporating an onboard electronic gating structure.

For the ultra-violet region of light below 224 nm, the substrate is preferably made of UV sensitised silicon, or more simply chemical vapour deposition (CVD) diamond. For the visible region, and the infra-red region, silicon, gallium arsenide and indium phosphide are suitable detector materials, among other solid state materials.

Such an arrangement can give exceptionally high electrically controlled gating speeds for photon and particle detection across the visible, UV and x-ray range, and also for neutrons. X-ray detectors will normally—but not exclusively—incorporate high z materials in front of the detector medium. In exceptional cases, it may be necessary for the detector to have low efficiency to avoid electronic pile-up. For neutron detection, low z materials may be incorporated in front of the plane of, between the individual elements of, or actually within, the detector material.

The advantages of using diamond are many fold. Diamond can be made extremely transparent in the wavelengths greater than 224 nm, and it is also the best heat conductor and diffuser known, at room temperature. Due to the small voltage required efficiently to extract electron-hole pairs, the gate voltage can be relatively small, and therefore easily generated with a fast rising and falling edge. This contrasts with the kV range required to gate channel plate devices. Preferably, the gating structure comprises a gate electrode (for example a strip electrode) spaced between the first and second electrodes. Due to the geometry of this gating strip (which may be of the order of one micrometre in width) the capacitative coupling between the gate and the first and second electrodes is minimised. This has the advantage both of increasing the speed of the gating operation (since less current needs to be driven), and minimising the noise signal generated by the gate pulse in the measured photocurrent. Diamond's exceptional electrical properties also allow for the operation of efficient strip lines, and this allows for minimum dispersion of the gating pulse.

The invention extends to a multi-strip array detector comprising a plurality of solid state microstructures as previously defined, all on a single substrate. The size of the individual microstructures may be smaller than 500 micrometres in dimensions perpendicular to the incident radiation, and typically of order ten micrometres. We envisage more advanced manufacturing technologies being able to reach sub micrometre structures in the immediate future. The multi-strip detector may comprise a plurality of individual ridge detector elements each having first and second electrodes on opposing sides thereof, and the detector elements may be commonly gated.

The invention extends to any one or more features described, shown in the drawings or claimed, whether taken alone or in any compatible combination.

The invention may be carried into practice in a number of ways, and several specific embodiments will now be described, by way of example, with reference to the accompanying drawings, in which:

DETAILED DESCRIPTION OF THE PREFERRED EMBODIMENTS

Figure 1A:
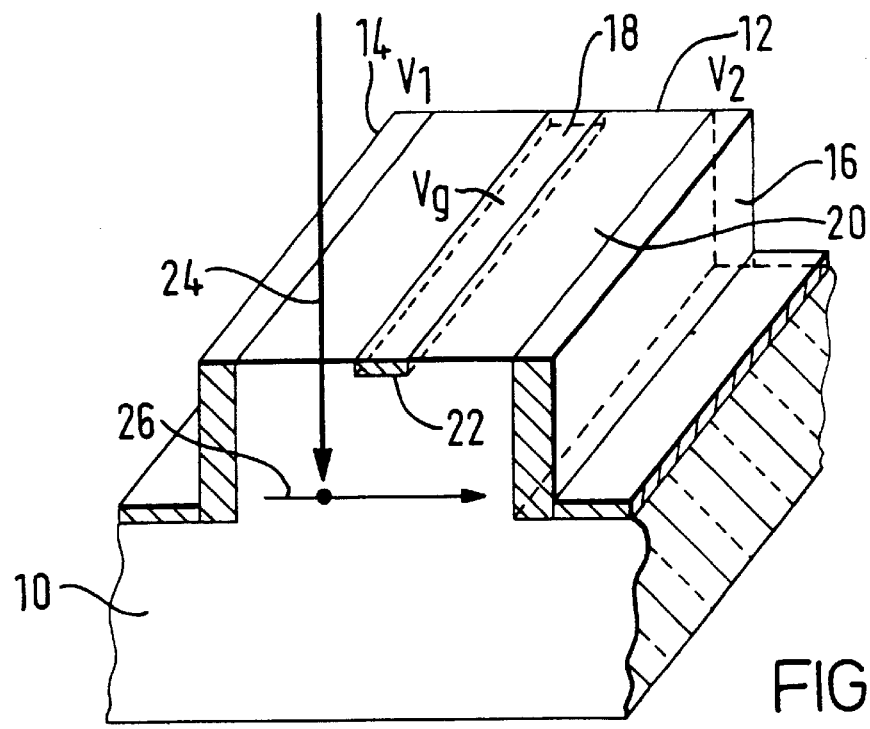
FIG. 1a and 1b schematically illustrate a fast gated diamond microstructure, particularly suitable for time resolved detection of visible, UV and X-ray photons, and for ionising particles.
Figure 1B:
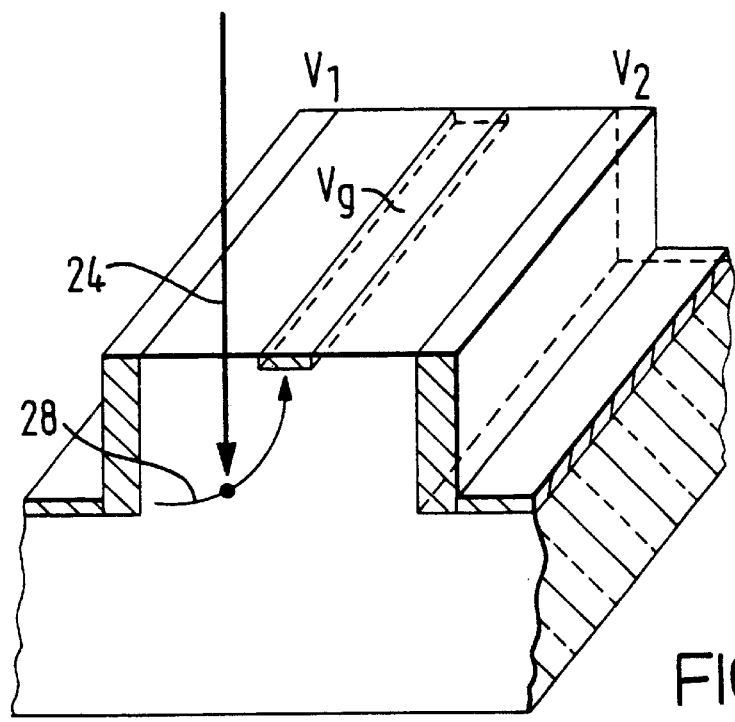

Turning first to FIG. 1a and 1b, these shows a particular microstructure embodiment in which the gating is electronic. The embodiment shown is, it is believed, particularly suitable for the time resolved detection of visible, UV and X-ray photons, and ionising particles.

As may be seen in FIG. 1a, the device comprises a CVD (Chemical Vapour Deposition) diamond substrate 10 having a plurality of upstanding parallel ridges 12, only one of which is shown. Each ridge 12 has first and second substantially parallel sides, which are respectively provided with first and second metallisation layers or electrodes 14,16.

Metallisation, in this context, includes one or more layers of metals such as gold, platinum, chromium and/or tungsten in various orders and combinations, so as to create an ohmic contact for electrical connections. A significant fraction of each electrode is perpendicular or roughly perpendicular to the substrate plane. The upper surface 20 of each ridge is substantially flat, and is provided with a shallow central channel 22 within which there is a metallisation gate 18. (In other arrangements, not shown, the channel could be dispensed with, the gate metal simply being on and/or in the substrate surface).

In use, the ionising particle or photon flux 24 to be detected impinges upon the upper surface 20 of the ridge 12. The width of the ridge 12 is matched to the charge recombination length in the diamond, defined here as being the typical or average distance electrons and holes separate before being recombined in the substrate, so that with a moderate voltage of 1–5V/$\mu$m across the ridge, applied between the metallisation gates 14,16, electron-hole pairs are rapidly and efficiently extracted. Typically, the ridge width may be between 1 and 100 $\mu$m; for a 50V potential and a 20 $\mu$m spacing between the metallisation layers, the extraction time is of the order of 30 ps.

For ease of reference, the voltage on the first metallisation layer 14 will be referred to as $V_1$, the voltage on the second metallisation layer 16 will be referred to as $V_2$ and the gate voltage, on the gate 18, will be referred to as $V_g$. As is shown in FIG. 1a, if $V_2$ is greater than $V_1$ there will be current flow across the ridge structure in the direction of the arrow 26, which is composed of a leakage current (approximately proportional to the $V_2-V_1$) and a photocurrent (approximately proportional to the photon or particle flux 24). Measurement of the time-integrated photocurrent (the total charge passed) gives a direct measurement of the flux. The problem is then to gate the device in a suitably short time, and this is the function of the gate 18.

For fast gating of the photocurrent, the photon absorption depth should be smaller than the ridge height, which will normally be true for photon energies in the 5.5–100 eV range where near-surface absorption dominates. Alternatively, the recombination range of the diamond substrate should be smaller than the ridge height, when using photons in the 1.8–5.4 eV and greater than 100 eV ranges. The former condition is easily satisfied since for any given application, the ridge width is a free parameter which may be determined by the diamond recombination length. The only exception may be for very fine ridges, where manufacturing limitations may become important. The latter condition may be ensured either by suitable control of the CVD growth conditions, or by ion or electron bombardment to generate lattice. In this way, the photocurrent is solely dependent upon the light or particles absorbed in the ridge rather than in the substrate. By applying a gate voltage $V_g$, greater than $V_2$, to the gate strip, as is shown in FIG. 1b, the photocurrent may be gated by diverting it principally to the strip (see the arrow 28). In this way, the current flow may rapidly be turned on and off by the application of a suitable voltage $V_g$ applied to the gate. In diamond in particular, the velocity of electron is exceptionally high in the configuration described, and so the gate is very fast.

Figure 2A:
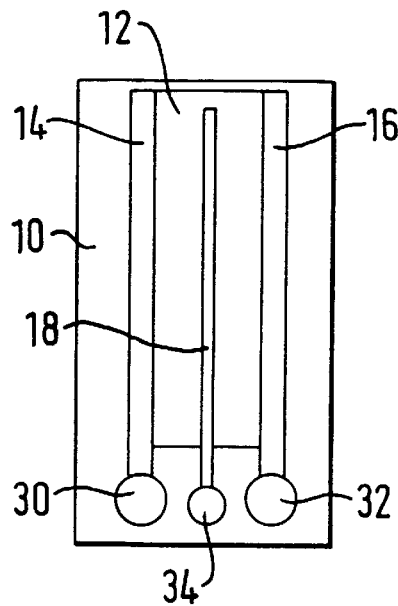
FIG. 2a shows a strip gated detector using the microstructure of FIG. 1a and 1b.

According to the particular application, it is envisaged that the device may either have a single ridge 12 or a plurality of parallel ridges. A single strip embodiment is shown schematically in FIG. 2a. This figure also shows the preferred contact pads 30,32,34 at the end of the ridge respectively for making electrical connections with the metallisation layers and with the gate.

Figure 2B:
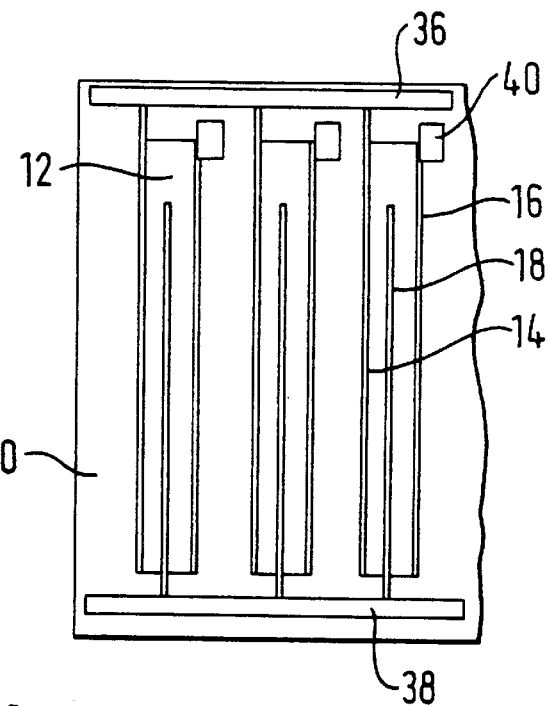
FIG. 2b shows a multi-strip array detector using the same basic microstructure.

A plurality of such devices may be coupled together, as shown in FIG. 2b, to create a multi-strip array detector. This has a common $V_1$ bias strip 36, arranged simultaneously to provide an identical bias voltage to each of the first metallisation layers 14. A common gate strip 38 provides a common gating voltage $V_g$ to each of the gates 18. Each strip or ridge has an individual strip readout pad 40, coupled to the second metallisation layer 16. As will be appreciated, such a multi-strip device provides one degree of spatial resolution. It is likely to be suitable for applications in which a relatively large sensitive area is required, for example lidar, where the gate is to be synchronised with a repetitive probe signal.

Figure 3:
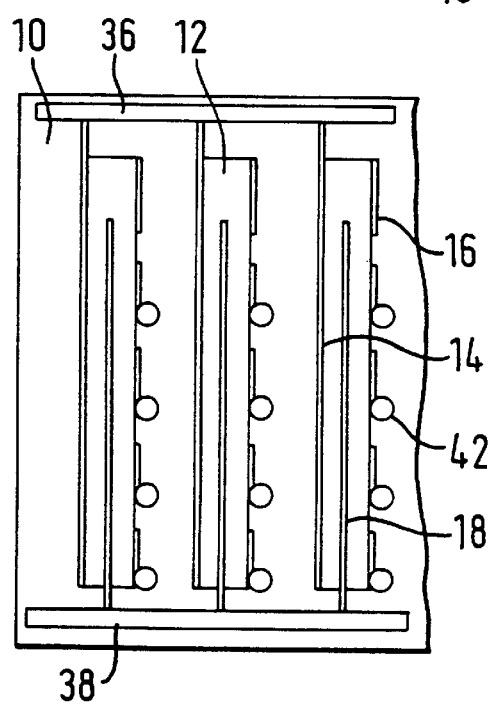
FIG. 3 shows a pixel gated strip device using the same microstructure.

Another embodiment is shown in FIG. 3, in which the strip readout pads 40 are replaced with individual pixel readout pads 42, there being several such pads per metallisation layer 16. Such a device provides two-dimensional imaging capabilities.

Any of the embodiments of FIGS. 1 to 3 may be adapted as an x-ray detector by the incorporation of additional high z showering material, positioned immediately in front of the detector. Likewise, any of the embodiments may be suitable for use as a neutron detector, with the addition, either as a separate layer, interdispersed, or implanted or grown into the substrate itself, of a low z showering material.

In the variations comprising a plurality of parallel ridges, absorber material may be located, as necessary, between the parallel sides of adjacent detector elements. The structures described may be etched, artificially grown or manufactured in any other suitable manner.

What is claimed is:

1. A solid state microstructure comprising:
   a substrate; and,
   a detector element extending outwardly from a surface of the substrate and having first and second electrodes on opposing vertical sides thereof, the detector element incorporating an onboard electronic gating structure.

2. A microstructure as defined in claim 1 wherein the detector element is of diamond.

3. A microstructure as defined in claim 2 wherein the detector element is of chemical vapour deposition diamond.

4. A microstructure as defined in claim 1 wherein the detector element is unitary with the substrate.

5. A microstructure as defined in claim 1 wherein the detector element includes an elongate ridge structure.

6. A microstructure as defined in claim 1 wherein the opposing sides of the detector element are substantially parallel.

7. A microstructure as defined in claim 6 wherein the substrate is generally planar, with the opposing sides of the detector element being substantially normal to the plane of the substrate.

8. A microstructure as defined in claim 1 wherein the gating structure includes a gate electrode spaced between the first and second electrodes.

9. A microstructure as defined in claim 8 wherein the gate electrode is carried on an outermost surface of the detector element.

10. A microstructure as defined in claim 8 wherein the gate electrode is carried in a channel in an outermost surface of the detector element.

11. A microstructure as defined in claim 8 wherein the detector element includes an elongate ridge structure, the gate electrode comprising a strip electrode running along the length of the ridge structure.

12. A microstructure as defined in claim 1 wherein the microstructure has a maximum external dimension of less than 500 micrometres.

13. A microstructure as defined in claim 1 wherein the microstructure has a maximum external dimension of less than 100 micrometres.

14. A microstructure as defined in claim 1 wherein the detector element is of silicon, gallium arsenide or indium phosphide.

15. A microstructure as defined in claim 1 further including a high z material in front of the detector element arranged and adapted to detect x-ray.

16. A microstructure as defined in claim 1 further including a low z material in front of, adjacent to, or incorporated within the detector element arranged and adapted to detect neutrons.

17. A microstructure as defined in claim 1 including a plurality of elongate detection elements on the substrate, each detector element having respective first and second electrodes, and the detector elements being commonly gated.

18. A microstructure as defined in claim 17 wherein each detector element is read out separately via its respective second electrode.

19. A microstructure as defined in claim 17 wherein each detector element has a plurality of second electrodes, spaced along its length, each second electrode being read out separately.

* * * * *